United States Patent [19]
Saitoh et al.

[11] Patent Number: 6,166,977
[45] Date of Patent: Dec. 26, 2000

[54] ADDRESS CONTROLLED SENSE AMPLIFIER OVERDRIVE TIMING FOR SEMICONDUCTOR MEMORY DEVICE

[75] Inventors: Ken Saitoh, Yokohama; Shoji Wada, Tokyo, both of Japan

[73] Assignee: Texas Instruments Incorporated, Dallas, Tex.

[21] Appl. No.: 09/272,872

[22] Filed: Mar. 19, 1999

Related U.S. Application Data

[60] Provisional application No. 60/078,828, Mar. 20, 1998.

[51] Int. Cl.[7] ............................................. G11C 7/00
[52] U.S. Cl. ............................ 365/205; 365/194; 365/207
[58] Field of Search ..................................... 365/205, 207, 365/194

[56] References Cited

U.S. PATENT DOCUMENTS

| | | | |
|---|---|---|---|
| 5,477,498 | 12/1995 | Ooishi ....................................... | 365/205 |
| 5,793,689 | 8/1998 | Yoon et al. ............................... | 365/205 |
| 6,028,812 | 2/2000 | Tanaka ...................................... | 365/205 |
| 6,061,278 | 5/2000 | Kato et al. ............................... | 365/205 |

*Primary Examiner*—Son T. Dinh
*Attorney, Agent, or Firm*—Wade James Brady, III; Frederick J. Telecky, Jr.

[57] ABSTRACT

A dynamic random access memory device having a number of sense amplifier banks (404a–404h) is disclosed. Each sense amplifier bank (404a–404h) has an associated memory array (402a–402h) and supply switch (406a–406h). In a given sense operation, data signals are coupled from a memory array (402a–402h) to its associated sense amplifier bank (404a–404h). Selection of the memory array (402a–402h) is determined by address signals (MS0–MS7). The supply switches (406a–406h) provide a sense amplifier supply voltage at a supply node (708) of its associated sense amplifier bank (404a–404h). At the initial portion of a sense operation, the supply switch (406a–406h) couples the high power supply voltage (VDD) to its associated supply node (708). After a predetermined time period, the supply switch couples a reduced array voltage (VDL) to its associated supply node (708). The switching operation is determined by an overdrive signal (SAOV). The timing of the SAOV signal is based upon the location of the memory array (402a–402h) which is being accessed in the sense operation.

31 Claims, 5 Drawing Sheets

ADDRESS CONTROLLED SENSE AMPLIFIER OVERDRIVE TIMING FOR SEMICONDUCTOR MEMORY DEVICE

This application claims priority under 35 USC §119(e)(1) of provisional application No. 06/078,828 filed Mar. 20, 1998.

TECHNICAL FIELD

The present invention relates generally to semiconductor memory devices, and more particularly to data sensing and timing circuits for semiconductor memory devices.

BACKGROUND OF THE INVENTION

Integrated circuits (ICs) can include a large number of interconnected devices, such as transistors, capacitors and resistors, that are formed on the same semiconductor substrate. One the great advantages of ICs is the uniformity of the various devices making up the integrated circuit. By fabricating hundreds or thousands of such devices with the same series of process steps, absent a processing defect, the various devices within the IC will operate in a generally uniform manner.

The uniformity of device response can be particularly advantageous in semiconductor memory ICs. Semiconductor memory ICs can include thousands of memory cells, each of which can store one or more data bits. By manufacturing memory cells having uniform responses, data can be stored and read from the memory cells in a predictable manner. For example, a single amplifier circuit is typically used to read data from, or write data into, a number of memory cells on a semiconductor memory IC. In a typical dynamic random access memory (DRAM), a single sense amplifier is used to read or write data for memory cells in a column of memory cells. If the characteristics of the memory cells varied in any significant manner, the sense amplifier response could also vary, and possibly result in an erroneous reading or writing operation.

While a semiconductor memory IC can be fabricated to provide uniformity in memory cell response, as semiconductor IC sizes increase, memory cell responses may be affected by the memory cell's particular position within the IC, due to variations in timing signals.

One particular example of a timing delay which affects memory cell response is set forth in FIG. 1. FIG. 1 is a block schematic diagram illustrating a DRAM device 100. The DRAM 100 is shown to include eight memory arrays 102a–102h, each having an associated sense amplifier bank 104a–104h. During an active cycle of the DRAM 100, memory cells within the memory arrays (102a–102h) are coupled to the sense amplifier banks (104a–104h). For example, in a read and refresh operation, memory cell data signals are amplified by the sense amplifier banks (104a–104h) and rewritten (refreshed) back into the memory cells. In the case of a read operation, the amplified data signal can be subsequently provided as output data. In a write operation, data is written into the memory cells by the sense amplifier banks (104a–104h) according to externally applied data.

The prior art DRAM 100 of FIG. 1 illustrates an example of a DRAM IC that utilizes a reduced array voltage. Reduced array voltages are used to improve the power consumption characteristics and reliability of a DRAM IC. Referring now to FIG. 2, a portion of a memory cell array 102 and a sense amplifier bank 104 are shown in a schematic diagram. The memory cell array 102 includes a pair of bit lines 200a and 200b, and a DRAM memory cell 202. The memory cell 202 includes an n-channel metal-insulator-semiconductor (MOS) pass transistor N200 coupled to a storage capacitor C200. The gate of transistor N200 is coupled to a word line 204, which is driven by a WL signal. The bit line pair (200a and 200b) is coupled to the sense amplifier bank 104 by a pair of transfer gates transistors N202 and N204. The gates of transistors N202 and N204 are driven by a signal TG. The magnitude of the voltage applied to the gate of transistors N200 can impact the reliability of the DRAM. The higher the voltage, the greater that chance that insulators surrounding the word line, particularly gate insulators, will break down and create a short circuit condition.

The portion of the sense amplifier bank 104 shown in FIG. 2 includes one sense amplifier 206, that has a high sense amplifier supply voltage, shown as SDP, and a low sense amplifier supply voltage, VSS. The sense amplifier 206 is activated by a sense amplifier enable signal /SAEN.

In order to reduce any threshold voltage drop caused by the pass transistors in a DRAM memory cell array, in operation, the gates of pass transistors are driven to a voltage that is higher than the voltage used by the sense amplifiers to refresh (or write) data in the storage capacitor. Initially, DRAM ICs included sense amplifiers which used the power supply voltage levels in refresh operations, and "booting" circuits which utilized a higher than power supply voltages to drive pass transistors. As thinner dielectrics are used, the reliability concerns noted above can come into play, placing a limit on the magnitude of the voltage that may be placed on a pass transistor gate. Thus, rather than use a booted voltage, the high power supply voltage of the DRAM IC is used to drive pass transistors, and a voltage less than a power supply voltage is used to refresh data. The same approach used to drive the pass transistors could be used to drive transfer gates, such as N202 and N204 in FIG. 2.

A drawback to using a reduced sense amplifier supply voltage is the reduced speed at which the sense amplifier will drive a bit line to a high voltage. One way to overcome this drawback, is to use a variable sense amplifier supply voltage. During the initial portion of a read/refresh operation, the sense amplifiers are supplied with the high power supply voltage to provide a rapid initial sense amplifier response. At a later portion in the read/refresh operation, the reduced voltage is provided to the sense amplifier. This is the approach illustrated by the DRAM of FIGS. 1 and 2.

In the case of the DRAM 100 of FIGS. 1 and 2, the high power supply voltage is designated as VDD, and the reduced array voltage is designated as VDL. Thus, the word line signal WL and the TG signal are driven between a low power supply voltage VSS and the high power supply voltage VDD. In addition, while the low sense amplifier supply voltage is VSS, the high sense amplifier supply voltage is SDP. The SDP voltage varies between the VDD voltage level and the VDL voltage level.

Referring back to FIG. 1, it is shown that in the DRAM 100, the sense amplifier banks (104a–104h) each receive an enable signal, /SAEN. When the /SAEN signal is low, the sense amplifier banks (104a–104h) are enabled, and when /SAEN signal is high, the sense amplifier banks (104a–104h) are disabled. Each sense amplifier bank (104a–104h) also receives the sense amplifier supply voltage SDP. The SDP voltage is generated by a supply switch circuit 106 activated by a supply switch signal /SDP_EN. When the /SDP_EN signal is high, a VDL supply voltage 108 is used to generate the SDP voltage. When the /SDP_

EN signal is low, a VDD supply voltage 110 is used to generate the SDP voltage.

A drawback to the prior art DRAM 100 arises from the propagation delay within the DRAM 100. In the event the single switching signal /SDP_EN is not properly timed with the activation of the sense amplifiers by the /SAEN signal, the voltages on the bit lines within different memory array (102a–102h) may not be uniform. This drawback is best illustrated by the timing diagram of FIG. 3.

FIG. 3 is a timing diagram illustrating the operation and drawbacks of the prior art DRAM IC set forth in FIGS. 1 and 2. Three /SAEN signals and their corresponding bit line pair responses are illustrated. An ideal response is shown by waveforms 300, an "undershoot" response is shown by waveforms 302, and an overshoot response is shown by waveforms 304. The ideal response waveforms 300 will be discussed first. At time t0, a word line (shown as 204 in FIG. 2) rises from VSS to VDD, turning on a pass transistor (N200 in FIG. 2). This action results in a differential voltage developing between bit line pairs (BL and /BL). For the waveforms of FIG. 3, it is assumed that the memory cell coupled to bit line BL is charged to a positive potential, and so bit line BL begins to rise at time t0. Also at the same time, the /SDP_EN falls from VDD to VSS. Referring back to FIG. 1, it is recalled that when the /SDP_EN falls from VDD to VSS, the supply switch circuit 106 switches from the VDL voltage supply 108 to the VDD voltage supply 110. Consequently, the sense amplifier supply voltage SDP rises at time t0, from VDL to VDD. This provides the initial fast sensing operation for the sense amplifier banks (104a–104h).

At time t1, the sense amplifier enable signal /SAEN falls from VDD to VSS. This enables the sense amplifiers. One bit line is driven to the sense amplifier low supply voltage (VSS) while the other is driven toward the sense amplifier high supply voltage (at time t1, this is VDD).

At time t2, the /SDP_EN falls from the voltage VDD to the voltage VSS. By operation of the supply switch circuit 106, the SDP voltage returns to the lower VDL supply voltage. The timing of the falling edge of the /SDP_EN signal is selected to coincide with the voltage of the BL reaching VDL. In other words, the time period from t1 to t2 is selected to be the time required for a sense amplifier with a supply voltage at VDD to charge bit line BL to the voltage VDL.

At time t3, the sense operation concludes with the WL signal returning to the VSS voltage. At the same time, the /SAEN signal goes from the VDD voltage to the VSS voltage, and an EQ signal rises from the VSS voltage to the VDD voltage. The EQ signal couples the bit lines together, to equalize the bit line potential. In the waveform 300 in FIG. 3, the equalization voltage is shown as VBLR, and is equal to ½ VDL, assuming VSS=0 volts.

The undershoot waveform 302 illustrates a case in which the sense amplifier enable signal /SAEN occurs later in time than the /SDP_EN signal. This may arise due to a propagation delay in the /SAEN signal. For example, referring back to FIG. 1, the ideal waveform 300 may represent the response of memory array 102h and sense amplifier bank 104h, while the undershoot waveform 302 may represent the response to memory array 102a and sense amplifier bank 104a. Because the sense amplifier bank 104a is physically situated further from the source of the /SAEN signal than sense amplifier 104h, the /SAEN signal as applied to sense amplifier bank 104a will be delayed with respect to sense amplifier bank 104h.

Referring once again to FIG. 3, it is shown that between times t0 and t1 the waveforms 302 have the same response as waveforms 300. The WL signal goes high, and a memory cell is coupled to one of the bit lines. As in the case of waveform 300 it is assumed that a positively charged memory cell capacitor is coupled to bit line BL.

Unlike the ideal response of wavefonns 300, in the undershoot example of waveforms 302, due to the delay between the falling edge of the /SAEN signal and the falling edge of the /SDP_EN signal, the sense amplifiers will be connected to the VDD voltage supply for a smaller amount of time than in the ideal case of waveforms 300. Consequently, at time t2, the voltage of bit line BL is at a potential less than the VDL voltage level when the sense amplifier switches from the VDD level to the VDL level.

Unlike the ideal response of waveforms 300, which maintains a VDL level between times t2 and t3, in the undershoot example of waveforms 302, between times t2 and t3, the bit line charges, at a slower rate, toward the VDL level. This arrangement is undesirable, as the data within the memory cell is refreshed during this time period. Because the voltage level is less than VDL, the storage capacitor will be charged by a voltage that is less than VDL, which may cause data retention failures in the memory cells.

At time t3, the bit lines of waveforms 302 are equalized. Because bit line BL has not yet reached the VDL level, the resulting equalization voltage is less than the BLR (½ VDD) potential. In the event the bit lines are connected to a ½ VDD precharge voltage, current will be drawn as the bit lines are brought back up to the BLR potential. Further, in the event the bit lines cannot be brought back to the BLR potential by the next read cycle, an erroneous read operation may result.

The overshoot waveforms 304 illustrates a case in which the sense amplifier enable signal /SAEN occurs earlier in time than the /SDP—EN signal. This may arise due to a propagation delay in the /SDP—EN signal, and serves to show the undesirability of having sense amplifiers drive bit lines above the array voltage VDL.

As in the case of waveforms 300 and 302, for the overshoot case of waveforms 304, it assumed that memory cell having a charged capacitor is coupled to bit line BL. Thus at time to, bit line BL begins to rise in potential.

Referring once again to FIG. 3, in the overshoot case of waveforms 304, the low-going edge of the /SAEN signal precedes the low-going edge of the /SDP_EN signal, resulting in the VDD supply being connected to the sense amplifier for a longer period of time than the ideal case. Consequently, from time t1 to t2, the voltage on bit line BL reaches, and then exceeds the VDL voltage level.

At time t2, as shown in waveforms 304, the SDP switches from the VDD level, back down to VDL. The bit line BL will then discharge toward VDL between times t2 and t3. This results in unwanted current consumption in this time period.

At time t3, the bit lines of waveforms 304 are equalized. Because bit line BL exceeds the VDL level, the resulting equalization voltage is greater than the BLR (½ VDD) potential. In a similar manner to the undershoot case 302, in the event the bit lines are connected to a ½ VDD precharge voltage, current will be drawn as the bit lines are brought back down to the BLR potential. In addition, in the event the bit lines cannot be brought back down to the BLR potential by the next read cycle, an erroneous read operation may result.

It would be desirable to provide a memory IC having a reduced array voltage that does not suffer from the adverse affects of timing differences between a switched sense amplifier power supply and other timed operations in the memory IC.

SUMMARY OF THE INVENTION

According to the preferred embodiment, a DRAM memory IC includes a number of sense amplifier banks, each coupled to a memory array. A power supply switch is coupled to each sense amplifier bank for providing a high power supply voltage or a reduced array voltage to the sense amplifier bank. Each of the power supply switches is enabled by a sense amplifier overdrive signal. The timing of the sense amplifier overdrive signal varies according to the sense amplifier bank position, reducing variation in bit line voltage caused by the position of a memory array in the DRAM memory IC.

According to one aspect of the preferred embodiment, the sense amplifier overdrive signal timing is varied by a plurality of memory address signals.

According to another aspect of the preferred embodiment, the sense amplifier overdrive signal timing is generated from a sense amplifier enable signal that is delayed according to the position of the word line in the DRAM memory.

DETAILED DESCRIPTION OF THE EMBODIMENTS

Figure 4:
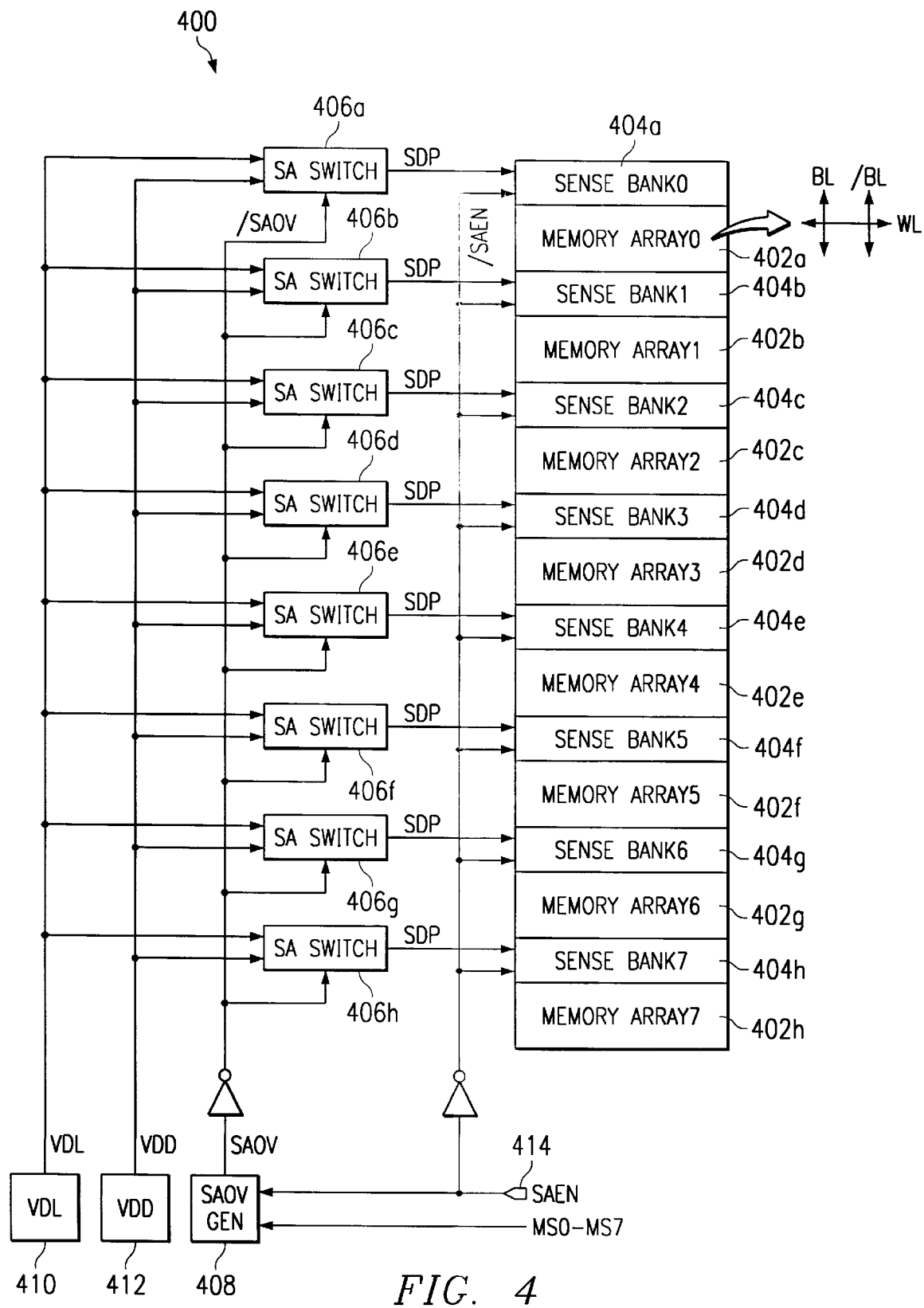
FIG. 4 is a block schematic diagram of a preferred embodiment.

Referring now to FIG. 4, a block schematic diagram is set forth illustrating a dynamic random access memory (DRAM) according to a preferred embodiment. The DRAM is designated by the general reference character 400, and is shown to include a plurality of memory arrays 402a–402h, each having an associated sense amplifier bank 404a–404h. The memory arrays (402a–402h) include memory cells arranged in rows and columns, with the memory cells in like rows being commonly coupled to a word line, and the memory cells in like columns being coupled to bit line pairs. The direction of the bit lines and word lines is shown in FIG. 4, to the right of memory array 402a.

Figure 1:
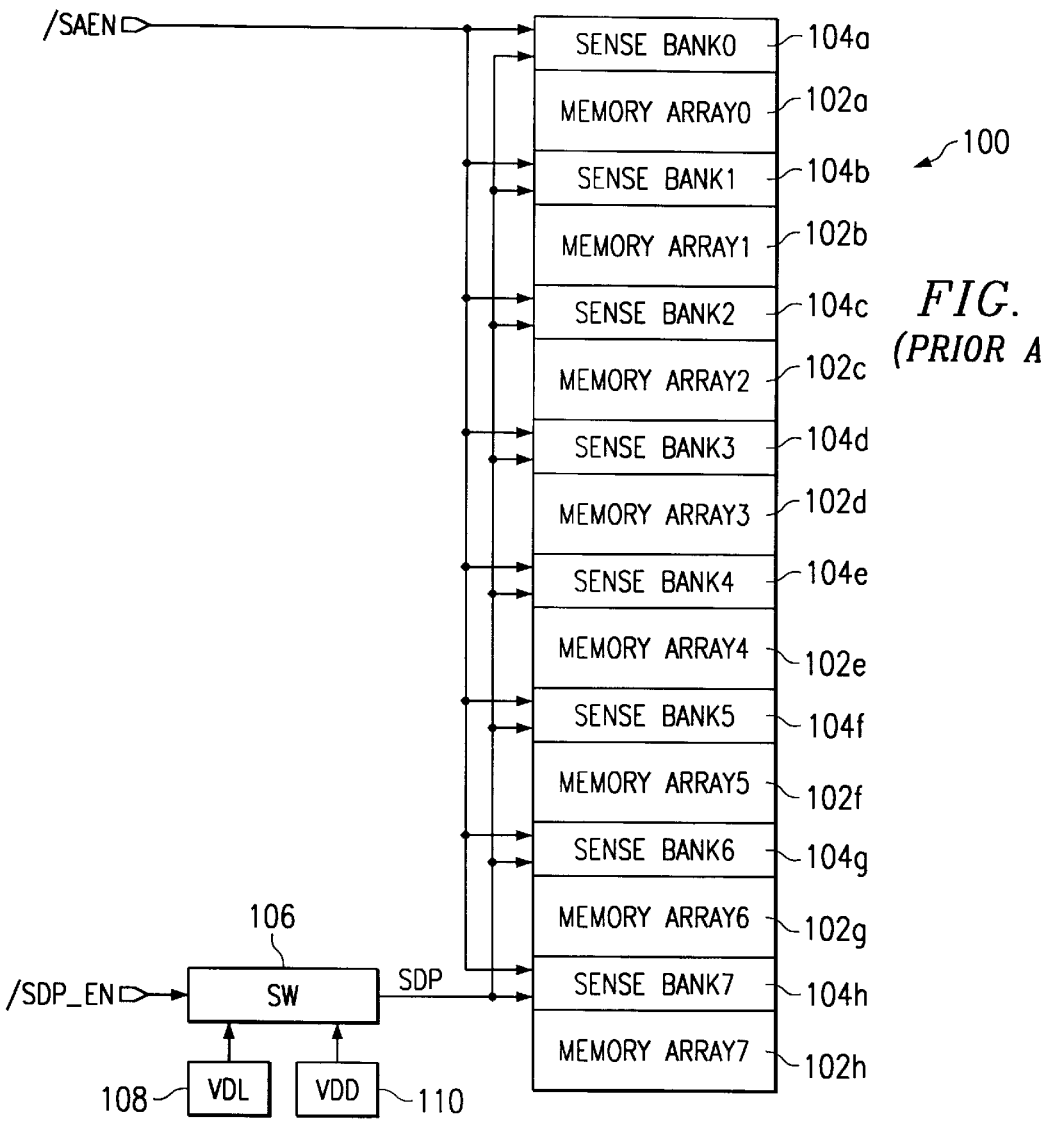
FIG. 1 is a block schematic diagram of a prior art DRAM integrated circuit.
Figure 2:
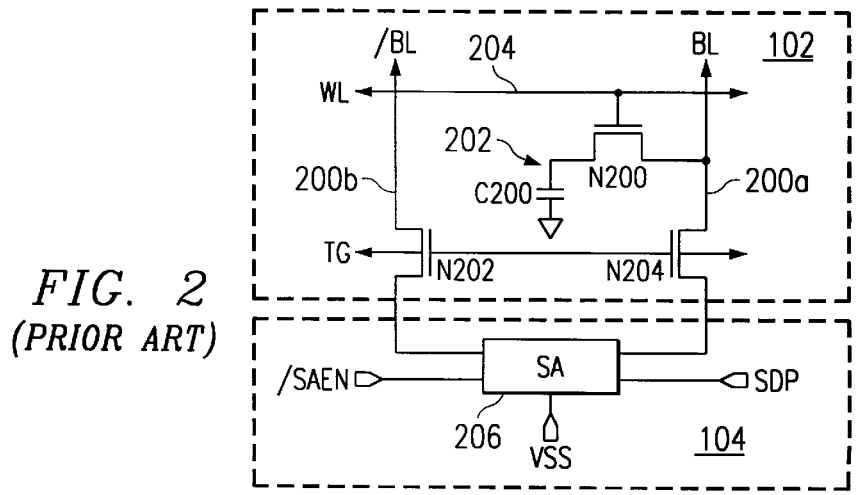
FIG. 2 is a schematic diagram illustrating the memory cell array and sense amplifier bank of the prior art.
Figure 3:
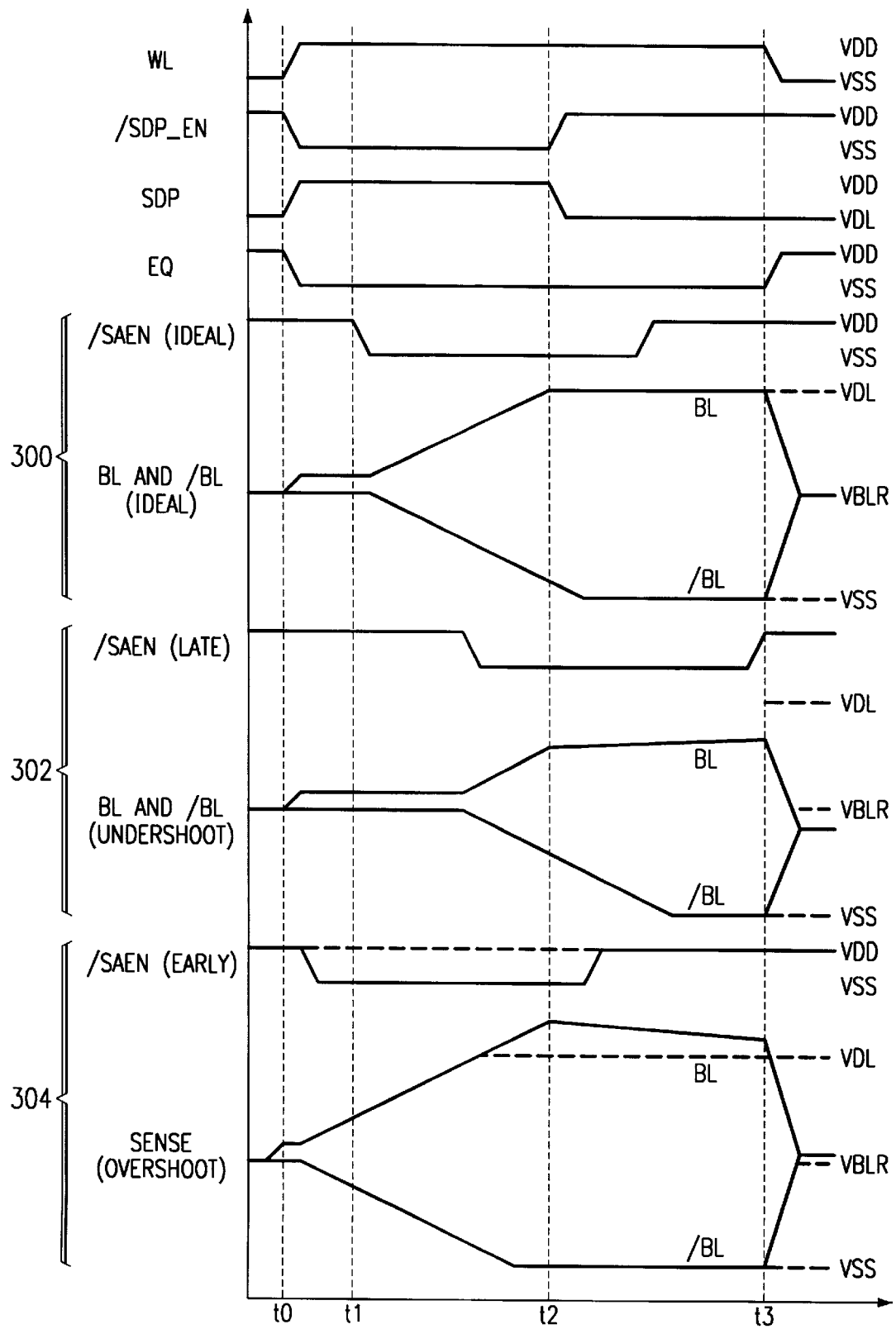
FIG. 3 is a timing diagram illustrating the operation of drawbacks of the prior art DRAM integrated circuit of FIGS. 1 and 2.

Each sense amplifier bank (404a–404h) receives a high sense amplifier (SA) supply voltage SDP, from a supply switch 406a–406h. The magnitude of the SDP supply varies according to the sense operation. Initially, the SDP supply is at the high power supply voltage VDD, to allow for fast sensing speed. Once bit lines are at, or near, a reduced array voltage VDL, the SDP supply switches to the VDL level. It is noted that, unlike the prior art case illustrated in FIG. 1, in which a single switch 106 provides a single sense amplifier supply voltage SDP to all sense amplifier banks (104a–104h), the preferred embodiment includes multiple supply switches (406a–406h).

Each of the supply switches (406a–406h) receives a high power supply voltage VDD, and the reduced array voltage VDL, and couples one or the other to its respective sense amplifier bank (404a–404h) according to a sense amplifier enable signal (/SAEN). When the /SAOV signal is high, indicating no overdrive condition, the VDL voltage is coupled to each sense amplifier bank (404a–404h). When the /SAOV signal is low, indicating an overdrive condition, the VDD voltage is coupled to each sense amplifier bank (404a–404h).

The SAOV signal (the non-inverted form of the /SAEN signal) is provided by an SAOV generator 408. Unlike the timing signal /SDP_EN of the prior art DRAM shown in FIG. 1, which maintains the same timing in any sense operation, the timing of the SAOV signal will vary depending upon which of the memory arrays (402a–402h) is being accessed.

The preferred embodiment 400 also includes a high power voltage supply 412, for providing the VDD voltage to the supply switches (406a–406h), and a reduced array voltage supply 410, for providing the VDL voltage to the supply switches (406a–406h). The high power supply voltage 412 may be a pin on an integrated circuit that includes the preferred embodiment. The pin may provide a high power supply voltage to the entire integrated circuit, or may be a pin dedicated to supplying power to the sense amplifier circuits. The reduced array voltage supply 410 may be a voltage regulator circuit.

Figure 5:
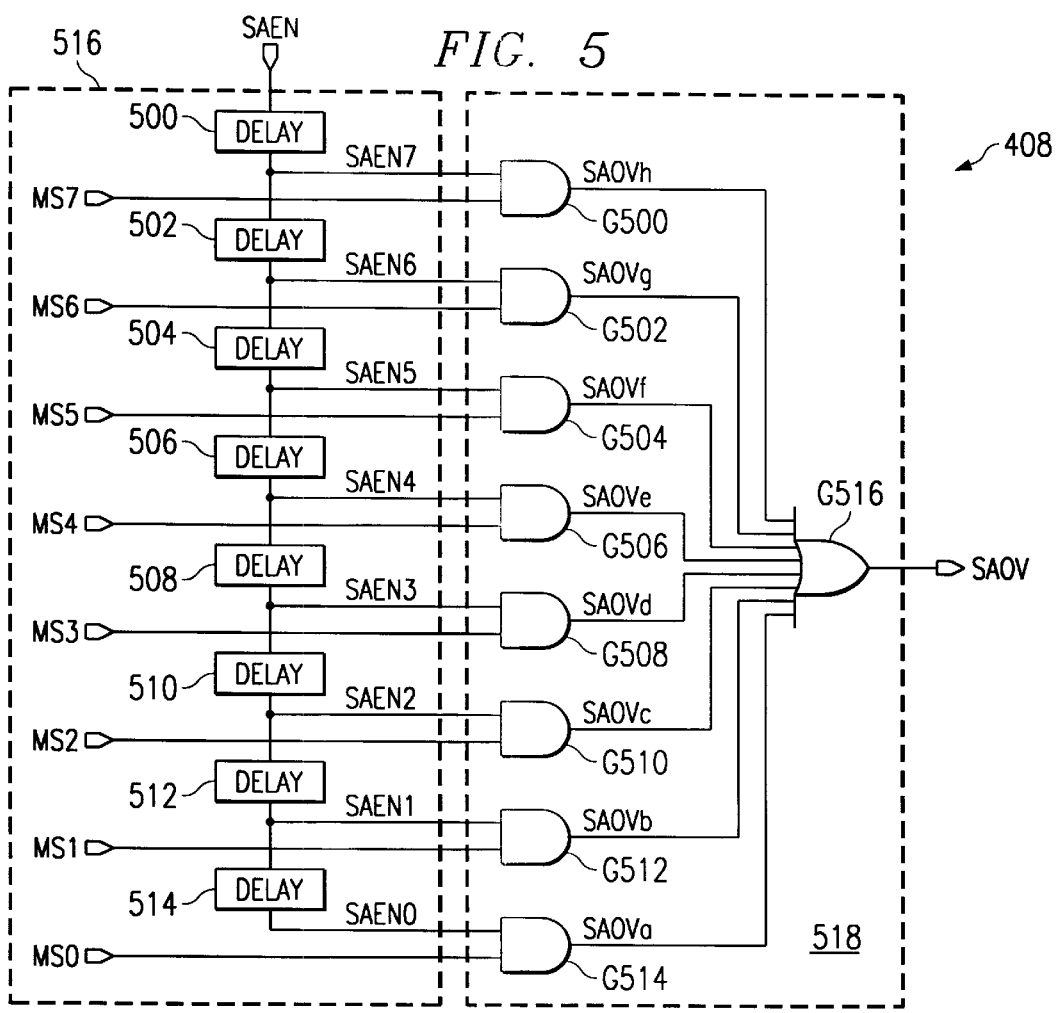
FIG. 5 is a logic diagram of a sense amplifier signal generator according to the preferred embodiment.

Referring now to FIG. 5, a logic diagram is set forth illustrating the SAOV generator 408 of the preferred embodiment. The SAOV generator 408 receives a number of high order address signals MS0–MS7, each corresponding to one of the memory arrays (402a–402h) set forth in FIG. 4. For example, when memory cells in memory array 402a are being accessed, the address signal MS0 will be high. Similarly, when memory array 402h is accessed, the address signal MS7 will be high. Each of the address signals MS0–MS7 is coupled as one input to one of eight AND gates, G500–G514.

It is understood, that while address signals MS0–MS7 can be directly related to externally applied address signals, this is not necessarily so. The address signals may be derived from combinations of address signals, or pre-decoded address signals. Further, the address signals may be generated by logically combining an address signal with one or more timing signals. Therefore, in the preferred embodiment, address signals are meant to provide information on the physical location of a read, write, and/or refresh operation.

The SAOV generator 408 also receives a sense amplifier enable signal SAEN. The signal SAEN is used to activate sense amplifiers within the sense amplifier banks (404a–404h). The SAEN signal is coupled through a series of delay circuits (500–514) to provide a second input to each of the AND gates. For example, the SAEN signal is coupled through a first delay circuit 500 to generate the second input to AND gate G500. To generate the second input to AND gate G502, the SAEN signal passes through the first and second delay circuits (500 and 502). It follows that the second input to gate G514 is generated by the SAEN signal passing through all eight delay circuits (500–514).

The output signals of AND gates G500–G514 are shown as SAOVa–SAOVh. These output signals (SAOVa–SAOVh) could be considered internal overdrive signals, which each correspond to a memory array 402a–402h. This arises from the fact that in order for each of the signals SAOVa–SAOVh to be active (a logic high in the preferred embodiment) the high order address bit of its corresponding memory array MS0–MS7 must also be active (high). As shown in FIG. 5, the signals SAOVa–SAOVh are provided as inputs to a select gate G516.

The select gate G516 functions to couple selected of the AND gate output signals (SAOVa–SAOVh) to the supply switches (406a–406h) to provide the /SAOV signal. As shown in FIG. 5, in the preferred embodiment, the select gate G516 is an eight-input OR gate. The output of the OR gate is the SAOV signal. This signal is subsequently inverted to generate the /SAOV signal that is used to activate the supply switches (406a–406h).

The delay circuits (500–514) of the SAOV generator 408 are provided to compensate for propagation delays that would result in undesirable timing variations between the enabling of the sense amplifier banks (404a–404h) and the raising of the sense amplifier supply voltage from the reduced voltage VDL and the high power supply voltage VDD. In the preferred embodiment, the incremental delay added to the SAEN signal is provided to account for the propagation delay caused by the incremental distance of each sense amplifier bank 404a–404h from the source of the SAEN signal 414.

An alternate way of conceptualizing the SAOV generator 408 is to consider the series connected delay circuits 500–514 as a delay signal generator 516, which provides a series of delayed enable signals (SAEN0–SAEN7). The AND gates G500–G514 and OR gate G516 can be considered a delayed enable signal selector 518, which selects one of the delayed enable signals according to an address signal (MS0–MS7).

Figure 6:
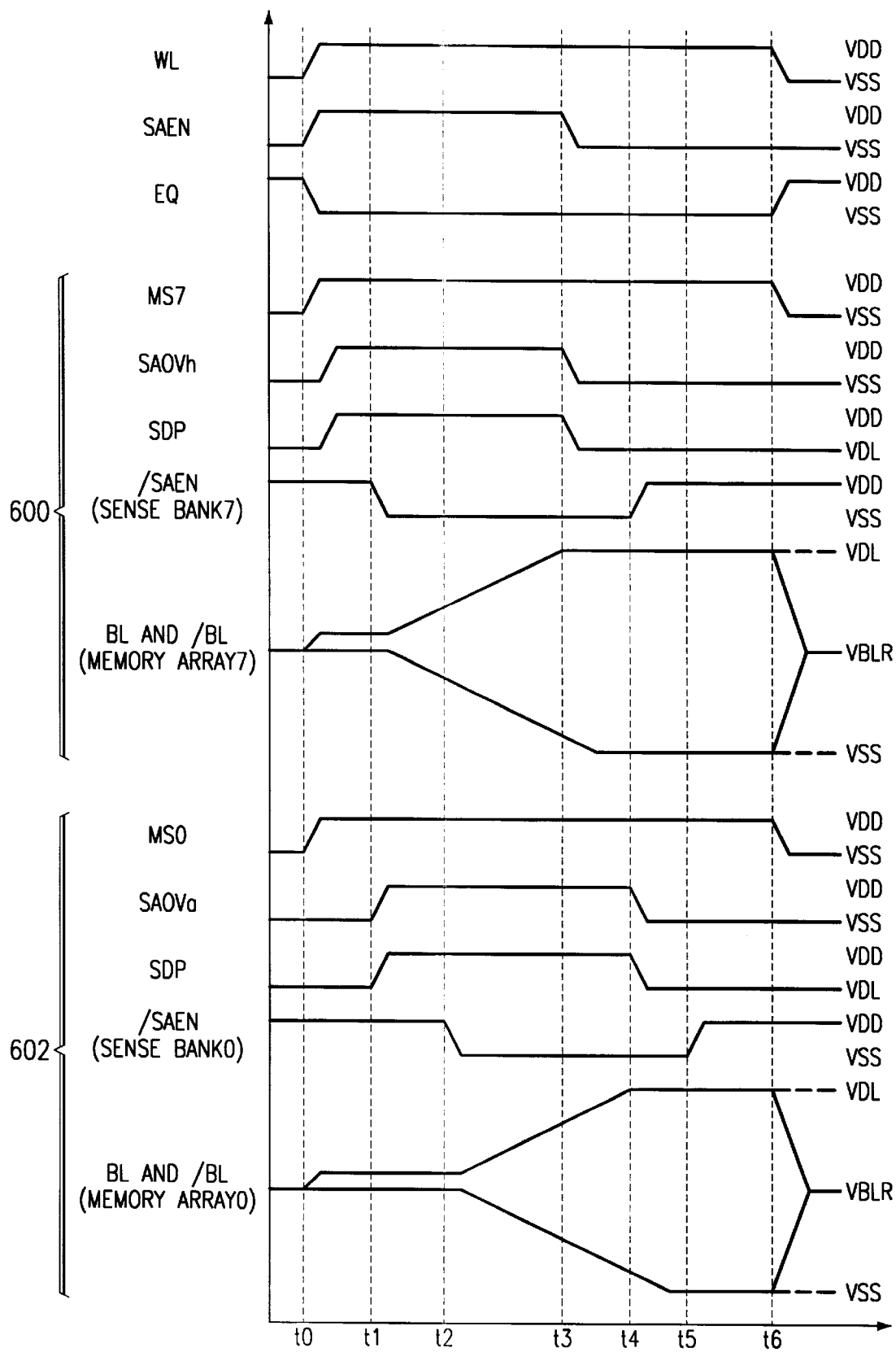
FIG. 6 is a timing diagram illustrating the operation of the preferred embodiment.

The operation of the preferred embodiment 400 is best understood with reference to FIGS. 4 and 5, in conjunction with FIG. 6. FIG. 6 is a timing diagram illustrating the timing signals of the preferred embodiment 400, and two examples of read operations from two different memory arrays. The first operation is shown by waveforms 600, and results in the reading of data from memory array 404h. The second operation is shown by waveform 602, and results in the reading of data from memory array 404a.

The waveforms WL, SAEN, and EQ are applicable to both the first operation and the second operation, and will be described first. At time t0, a word line in memory array 402h rises from the VSS voltage to a VDD voltage. The SAEN signal goes high, and begins to propagate to the sense amplifier banks (404a–404h). The EQ signal falls from VDD to VSS, allowing the bit lines to be driven to opposite voltage levels.

Referring now to the first operation illustrated by waveforms 600, it is shown that at time t0, the MS7 signal will be high, indicating a read operation is to take place for memory cells in memory array 402h. Referring back to FIG. 5, it is noted that the address signals MS0–MS7 are mutually exclusive. Therefore, when the signal MS7 is high, the signals MS0–MS6 are low, and the outputs of AND gates G502–G514 are all low. With MS7 high, the SAEN signal (delayed by delay circuit 500) will result in the output of G500 going high. In this manner, the SAOVh signal is driven high shortly after time t0. The high SAOVh signal is provided by OR gate G516 as signal SAOV. This signal is inverted to provide the /SAOV signal to the supply switches 406a–406h, resulting in the SDP signal shown in waveforms 600. Also at time t0, with the WL signal high, the bit line pairs in memory array 402h develop a differential voltage.

At time t1, the high going SAEN signal propagates to the sense amplifier bank 404h in the form of the low-going /SAEN signal shown in the waveform group of 600. The sense amplifier bank 404h is thus enabled at time t1, and the bit lines begin to be driven to opposite sense amplifier supply voltages. It is noted that the SDP supply is at the high power supply voltage VDD, providing for a rapid sense speed.

At time t3, the SAEN pulse returns to the VSS voltage level. As a result, after a delay introduced by delay circuit 500, one input of AND gate G500 goes low, and the signal SAOVh also goes low. The low SAOVh signal is coupled to the supply switches 406a–406h as signal SAOV, and results in the SDP signal returning to the reduced array voltage VDL, from the VDD voltage. It is noted that, at about time t3, the voltage on bit line BL is at, or near VDL. Thus, the switching of the SDP supply voltage from the VDD level to the VDL level, serves to maintain the bit line BL at the VDL voltage level, and avoids an undershoot or overshoot condition.

At time t4, due to the propagation delay, the /SAEN signal of waveforms 600, returns to the VDD voltage level, disabling the sense amplifier bank 404h.

At time t6, the WL signal returns low, and the EQ signal goes high, resulting in the equalization of the bit line pair BL and /BL of waveforms 600.

While the waveforms of 600 illustrate the accessing of a memory array 404h that is relatively close to the SAEN signal source 414, the waveforms of 602 represent the accessing of a memory array that is relatively far from the source of the SAEN signal 414. Because memory array 404h is accessed, the MS0 signal goes high at time t0.

At time t1, the signal SAOVa rises to a logic high. This is in contrast to the signal SAOVh of the waveforms 600, which is driven to a logic high shortly after time t0. Referring back to FIG. 5, it is shown that the SAOVh signal is generated by the logical ANDing of the MS0 address, and the SAEN signal, delayed by delay circuits 500–514. The high going SAOVa signal is translated into a high going SAOV signal by OR gate G516. The high going SAOV signal results in the SDP voltage rising from VDL to VDD at time t1. This is also in contrast to the first example of waveforms 600, in which the SDP signal is driven high shortly after time t0.

At time t2, the high going SAEN signal propagates to the sense amplifier bank 404a in the form of the low-going /SAEN signal shown in the waveform group of 602. It is noted that the /SAEN signal in the waveform group 602 occurs later in time than that of waveform group 600 due to the propagation delay of the SAEN signal. As the /SAEN signal falls, the sense amplifier bank 404a is enabled. Therefore, at time t2 the bit lines begin to be driven to opposite sense amplifier supply voltages. At this time, the high sense amplifier supply voltage SDP is at the high power supply voltage VDD, providing for the desirable rapid sense speed.

At time t4, the SAEN pulse has fully propagated through the delay circuits (500–514), and the SAOVa returns to the low VSS logic level. This results in the switching supplies 406a–406h driving the SDP supply voltage from the VDD level back down to the reduced VDL level. At time t4, the bit line BL is at, or near, the VDL level, and so the switching of the SDP supply voltage serves to maintain the bit line at the VDL level. Thus, despite the distance of the memory array 402a from the source of the SAEN signal, the overshoot and undershoot condition can be avoided by delaying the SDP supply transition.

At time t5, the /SAEN pulse which enables sense amplifier bank 404a, returns to the high VDD level, disabling sense amplifier bank 404a.

At time t6, the word line returns low and the EQ signal returns to the high level, resulting in the equalization of the bit lines pair BL and /BL.

FIG. 6 illustrates an approach in which the duration of the /SAEN pulse is longer than the amount of time required to charge the bit line BL to the VDL level. Thus, it is the switching of the SDP supply voltage from the VDD level to the VDL level that terminates the "rapid" sensing portion. Accordingly, in the waveform groups of 600 and 602, the time between the falling edge of the /SAEN signal and the falling edge of the corresponding SDP signal is the time required to charge the bit line to the VDL level. Thus, by delaying the falling edge of the SDP signal according to which bank of sense amplifiers is being activated, the bit lines in each bank can be driven to uniform voltages. The delays can be optimized for each sense amplifier bank, by adjusting the delay introduced by each delay circuit 500–514.

Figure 7:
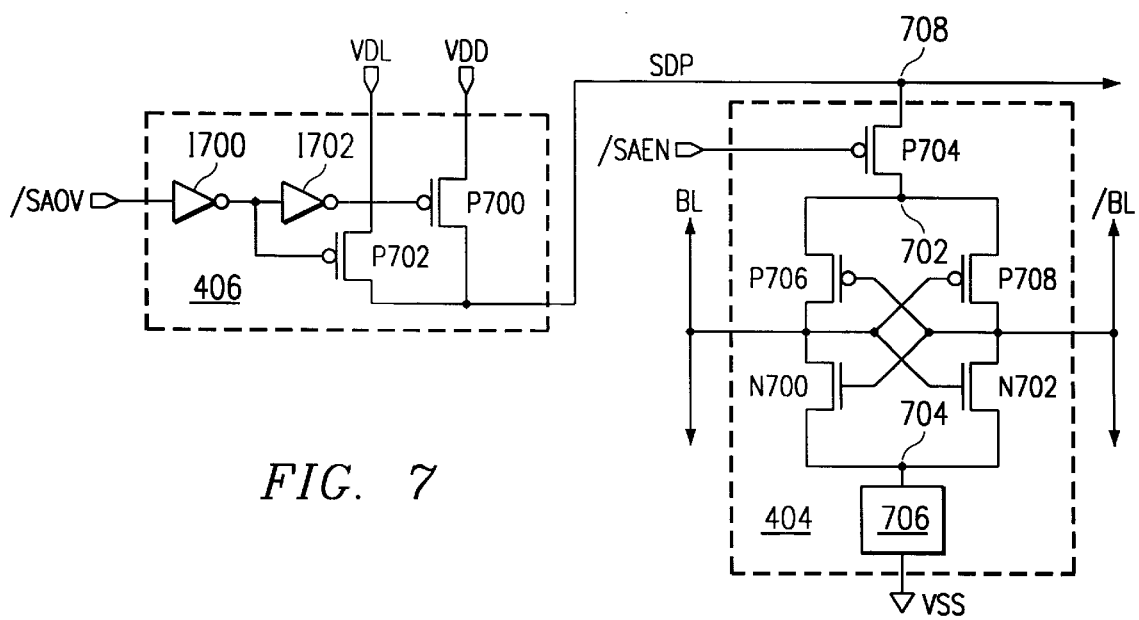
FIG. 7 is a schematic diagram illustrating a supply switch and sense amplifier bank of the preferred embodiment.

FIG. 7 sets forth a supply switch 406, and a portion of a sense amplifier bank 404. The supply switch 406 is shown to include two p-channel MOS transistors P700 and P702. The source of transistor P700 is coupled to the supply voltage VDD, and the source of transistor P702 is coupled to the reduced supply voltage VDL. The drains of the transistors P700 and P702 are coupled together, and provide the sense amplifier high supply voltage, SDP. The /SAOV signal is applied directly to the gate of transistor P702 by way of an inverter I700, to the gate of transistor P700 by way of inverters I700 and I702.

The portion of the sense amplifier bank 404 shown in FIG. 7 is one sense amplifier for driving a pair of bit lines (BL and /BL). The sense amplifier is shown to include a first complementary MOS driver (P706 and N700) and a second complementary MOS driver (P708 and N702), cross-coupled between the bit line pairs BL and /BL. The sources of transistors P706 and P708 form a pull-up node 702, and are commonly coupled to the supply switch 406 by a p-channel pull-up transistor P704. The gate of transistor P704 is driven by the /SAEN signal. The common sources of transistors N700 and N702 form a pull-down node 704, and are coupled to the low power supply voltage VSS by a pull-down circuit 706. The pull-down circuit 706 may be one or more n-channel pull-down transistors having gates which receive the SAEN signal.

It is understood that the common drains of transistors P700 and P702 in the supply switch 406 form a sense amplifier supply node 708 which provides the SDP supply voltage to all, or a portion of, the sense amplifiers in a bank.

While the preferred embodiment describes a DRAM sensing scheme in which the sense amplifier "pull-up" voltage is initially at the high power supply voltage, and subsequently falls to a reduced voltage, the same approach could be used for the "pull-down" voltage of a sense amplifier. Such a case would arise in the event the low bit line voltage was above the low power supply voltage. It is also understood that the teachings of the present invention may be used in other types of memory devices in the event multiple sense amplifier supply voltages are utilized. Further, while the preferred embodiment employs a particular type of CMOS sense amplifier, this should not be construed as limiting the invention thereto. Memory devices utilizing different types of sense amplifiers may also benefit from the teachings disclosed herein.

An advantage of the present invention is that the delay introduced by the delay circuits 500–514 can be adjusted so that the SAOV signal is properly timed for the location of each array. It is noted that the preferred embodiment set forth in FIG. 4, illustrates a physical arrangement in which the sense amplifier banks (404a–404h) are each situated closer to the SAEN signal source 414 than the others (i.e., sense amplifier bank 402h is closest to the SAEN signal source 414 and sense amplifier bank 402a is farthest from the SAEN signal source 414). With this arrangement, the series connection of delay circuits 502–514, will generate set of increasing delays required for the increasing distance of each sense amplifier bank. However, alternate memory device layouts may include a centrally located SAEN signal sources, with sense amplifier banks being situated around the SAEN signal sources. In such an arrangement, the delay circuits may be connected in parallel to the SAEN signal source.

A parallel arrangement of delay circuits could also be used for the preferred embodiment architecture. The delay circuits could each, by themselves, introduce longer and longer delay times (i.e., not rely on the accumulation of individual delays). For example, delay circuit 500 could introduce the shortest delay, while delay circuit 514 could introduce the longest delay. The SAEN signal could then be coupled directly to the input of each delay circuit 500–514.

Accordingly, although the present invention has been described in detail, it should be understood that various changes, substitutions, and alterations could be made without departing from the spirit and scope of the invention as defined by the appended claims.

What is claimed is:

1. A random access memory device, comprising:
   a plurality of banks of sense amplifiers;
   a first power supply voltage;
   a reduced array voltage;
   a supply switch associated with each bank of sense amplifiers, the supply switch coupling the first power supply voltage to its associated bank of sense amplifiers in response to an overdrive indication, and coupling the reduced array voltage to its associated bank of sense amplifiers in response to a reduced voltage indication; and
   an overdrive signal generator including
      a plurality of delay circuits, each delay circuit including a delay input and a delay output, and
      a gate device associated with each delay circuit, each gate device having a gate input and a gate output, the gate input being coupled to the delay output of its associated delay circuit, each gate device being enabled by an address and providing an overdrive indication.

2. The random access memory device of claim 1, wherein:
   each sense amplifier bank includes a plurality of sense amplifiers.

3. The random access memory device of claim 2, wherein:
   each sense amplifier is enabled in response to a sense amplifier enable indication.

4. The random access memory device of claim 3, wherein:
   each supply switch couples the first power supply voltage to a supply node in response to the overdrive indication, and couples the reduced array voltage to the supply node in response to the reduced voltage indication; and
   each sense amplifier includes at least one enabling insulated gate field effect transistor (IGFET) for coupling the supply node to drive devices within each sense amplifier in response to the sense amplifier enable indication.

5. The random access memory device of claim 1, further including:
a first power supply pin for providing the first power supply voltage.

6. The random access memory device of claim 1, wherein:
the first power supply voltage is a high power supply voltage; and
the reduced array voltage is less than the first power supply voltage.

7. The random access memory device of claim 1, wherein:
the supply switch includes
a first power supply node coupled the first power supply voltage,
a reduced array supply node coupled to the reduced array supply voltage,
a first IGFET coupled between the first power supply node and a sense amplifier supply node, and
a second IGFET coupled between the second power supply node and the sense amplifier supply node.

8. The random access memory device of claim 7, wherein:
the first power supply voltage is a high power supply voltage; and
the first IGFET and the second IGFET are p-channel IGFETs.

9. The random access memory device of claim 1, wherein:
the plurality of delay devices are arranged in series.

10. The random access memory device of claim 1, wherein:
the gate devices of the overdrive signal generator each include an AND gate having at least two inputs and one output, one input of each AND gate being the gate input, the other input receiving one of the different address signals, and the output of the AND gate being the gate output.

11. The random access memory device of claim 1, wherein:
the overdrive signal generator further includes a select gate circuit for coupling selected of the gate outputs to an overdrive signal node.

12. The random access memory device of claim 10, wherein:
the select gate circuit is an OR gate receiving the gate outputs as input signals, the output of the OR gate being the overdrive signal node.

13. A semiconductor memory device, comprising:
a delay signal generator for receiving an enable signal and generating a plurality of delayed enable signals, each delayed enable signal being delayed with respect to the enable signal by a different delay period;
a signal selector circuit which receives the delayed enable signals and selects one of the delayed enable signals in response to at least one address signal, the signal selector circuit driving an overdrive node in response to the selected delayed enable signal to generate an overdrive signal having at least a first state and a second state;
a plurality of supply switch circuits, each supply switch circuit coupling a first voltage to a sense amplifier supply node when the overdrive signal is in the first state, and coupling a second voltage to the sense amplifier supply node when the overdrive signal is in the second state; and
at least one sense amplifier coupled to the sense amplifier supply node of each supply switch circuit.

14. The semiconductor memory device of claim 13, wherein:
the delay signal generator includes a plurality of delay circuits connected in series, beginning with a first delay circuit and ending with a last delay circuit, each delay circuit having an input and an output, the input of the first delay circuit receiving the enable signal, the outputs of the delay circuits each providing one of the delayed enable signals.

15. The semiconductor memory device of claim 13, wherein:
the signal selector circuit includes a plurality of logic gates, each logic gate receiving one of the delayed enable signals and an address signal as inputs, and providing a gate output signal.

16. The semiconductor memory device of claim 15, wherein:
the signal selector circuit further includes a selector gate for driving the overdrive node in response to the gate output signal.

17. The semiconductor memory device of claim 13, wherein:
the first voltage is a power supply voltage.

18. The semiconductor memory device of claim 17, wherein:
the second voltage is less than the power supply voltage.

19. The semiconductor memory device of claim 13, wherein:
the at least one sense amplifier includes a bank of sense amplifiers.

20. The semiconductor memory device of claim 19, wherein:
each bank of the sense amplifiers is coupled to a memory array.

21. The semiconductor memory device of claim 20, wherein:
the memory array includes a plurality of dynamic random access memory (DRAM) cells.

22. The semiconductor memory device of claim 13, wherein:
the at least one sense amplifier is enabled in response to the enable signal.

23. An integrated circuit for storing data, the integrated circuit comprising:
an enable signal source;
a plurality of memory arrays, each memory array including a plurality of memory cells coupled to bit lines, and being situated a different distance from the enable signal source, the memory cells in each memory cell array being accessed by the activation of an address;
a bank of sense amplifiers associated with each memory array, each bank of sense amplifiers being coupled to the bit lines of its associated memory array;
a first power supply node associated with each bank of sense amplifiers, each power supply node providing a sense supply voltage to its associated bank of sense amplifiers;
an overdrive signal circuit, for generating an overdrive indication in response to an enable signal, the overdrive indication having a delay with respect to the enable signal, the delay being determined by the address signals; and
a supply switch coupled to each first power supply node, each supply switch providing a power supply voltage to its corresponding power supply node in response to the overdrive indication.

24. The integrated circuit of claim 23, wherein:

each bank of sense amplifiers is enabled in response to the enable signal at the enable signal source.

25. The integrated circuit of claim 24, wherein:

the overdrive signal circuit generates an overdrive signal having a first logic state and a second logic state, the first logic state being the overdrive indication, the second logic state being a reduced voltage indication.

26. The integrated circuit of claim 25, wherein:

the supply switch provides a reduced voltage to its corresponding power supply node in response to the reduced voltage indication.

27. The integrated circuit of claim 26, wherein:

the power supply voltage is a high power supply voltage, the reduced voltage is less than the high power supply voltage.

28. The integrated circuit of claim 23, wherein:

the overdrive signal circuit includes
 a delay signal generator for generating a plurality of internal overdrive signals in response to the enable signal, and
 a select circuit for selecting one of the internal overdrive signal in response to an address.

29. The integrated circuit of claim 28, wherein:

the select circuit of the overdrive signal generator selects a different overdrive signal in response to different addresses.

30. The integrated circuit of claim 28, wherein:

the delay signal generator includes a plurality of delay circuits for receiving the enable signal.

31. The integrated circuit of claim 30, wherein:

the delay circuits are arranged in series.

* * * * *